United States Patent
Wang et al.

(10) Patent No.: US 11,763,899 B2
(45) Date of Patent: Sep. 19, 2023

(54) BALANCED THREE-LEVEL READ DISTURB MANAGEMENT IN A MEMORY DEVICE

(71) Applicant: Micron Technology, Inc., Boise, ID (US)

(72) Inventors: Jun Jun Wang, Shanghai (CN); Hua Tan, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 3 days.

(21) Appl. No.: 17/132,490

(22) Filed: Dec. 23, 2020

(65) Prior Publication Data

US 2022/0044744 A1 Feb. 10, 2022

Related U.S. Application Data

(63) Continuation of application No. PCT/CN2020/107862, filed on Aug. 7, 2020.

(51) Int. Cl.
| | | |
|---|---|---|
| *G11C 16/34* | (2006.01) | |
| *G11C 29/44* | (2006.01) | |
| *G11C 16/26* | (2006.01) | |
| *G11C 16/08* | (2006.01) | |

(52) U.S. Cl.
CPC ......... *G11C 16/3431* (2013.01); *G11C 16/08* (2013.01); *G11C 16/26* (2013.01); *G11C 29/44* (2013.01)

(58) Field of Classification Search
CPC ..... G11C 16/0483; G11C 16/08; G11C 16/26; G11C 16/3418; G11C 16/3431
See application file for complete search history.

(56) References Cited

U.S. PATENT DOCUMENTS

| | | |
|---|---|---|
| 2010/0107021 A1 | 4/2010 | Nagadomi et al. |
| 2013/0304982 A1 | 11/2013 | Jung et al. |
| 2013/0346805 A1 | 12/2013 | Sprouse et al. |
| 2016/0342458 A1* | 11/2016 | Cai ............ G11C 29/52 |
| 2018/0004415 A1 | 1/2018 | Lee et al. |
| 2019/0294358 A1* | 9/2019 | Suzuki .......... G06F 3/064 |

OTHER PUBLICATIONS

International Search Report and Written Opinion, PCT/US2020/107862, dated Apr. 26, 2021.

* cited by examiner

*Primary Examiner* — Alfredo Bermudez Lozada
(74) *Attorney, Agent, or Firm* — Greenberg Traurig

(57) ABSTRACT

Methods, systems, devices, and computer-readable media for performing read disturb management of a memory device. A method includes retrieving a value of a read counter for a block associated with a read request issued to a memory array; refreshing valid word lines in the block if the value of the read counter exceeds a first threshold; identifying a set of valid word lines in the block if the value of the read counter exceeds a second threshold, the second threshold lower than the first threshold; identifying a subset of the set of valid word lines, the subset of the set of valid word lines including word lines having an error rate above a pre-configured error rate threshold; and refreshing the subset of the set of valid word lines.

17 Claims, 5 Drawing Sheets

BALANCED THREE-LEVEL READ DISTURB MANAGEMENT IN A MEMORY DEVICE

RELATED APPLICATION

The present application is a continuation application of International Application No. PCT/CN2020/107862, filed Aug. 7, 2020, and entitled "BALANCED THREE-LEVEL READ DISTURB MANAGEMENT IN A MEMORY DEVICE," the entire disclosure of which application is hereby incorporated herein by reference.

FIELD OF THE TECHNOLOGY

At least some embodiments disclosed herein relate generally to memory devices and, in particular, to systems, methods, devices, and computer-readable media for reducing read stress in a memory device such as a NAND Flash device.

BACKGROUND

Memory devices, such as NAND Flash devices, frequently suffer from physical defects that cause logical errors in the storage of data. One such defect in a NAND Flash device is a read disturbance. A read disturbance occurs due to the physical structure of the NAND Flash device. In general, NAND Flash stores data in individual cells which comprise one or more transistor elements. When reading data from a cell, a read reference voltage is applied to cell and often to multiple cells connected via a word line. When this voltage is applied to one or more cells, the threshold voltages of a second, unread set of cells in the same block increase to a higher value. A single increase in threshold voltage usually does not impact the functioning of a cell. However, over time as these increases accumulate, the state of such cells is altered resulting in read disturb errors when reading from the cells.

DETAILED DESCRIPTION

The disclosed embodiments describe improved techniques for performing read disturb management in a memory device. Various embodiments directed to apparatuses, devices, computer-readable media, methods, and systems are disclosed. In the illustrated embodiment, read disturb management is performed in a memory device to prevent memory cells from degrading due to accumulated stress caused by reads. In some embodiments, the memory device comprises a NAND device. The following description references NAND Flash, however other memory types suffering from similar read disturb errors may be utilized.

During read disturb management, data in a given block of a memory device is refreshed and written to a different block before a read stress or read error threshold is reached. When this threshold is reached, or nearly reached, the memory device will proactively rewrite the data to avoid read disturb errors. The memory device then invalidates the block needing refreshing and clears a read count (e.g., sets a read count to zero) associated with the newly written data.

Generally, the above read disturb management operations are automatically performed by a memory device. For example, the operations may be implemented in software or firmware of the memory device. Alternatively, or in conjunction with the foregoing, the operations may be implemented in physical circuitry of the memory device. It is critical that the operations be efficient. If the operations are not efficient, the operations consume more active time of the memory device, preventing the memory device from response to read, write, and other host commands. Additionally, if the read disturb management operations are overly complex, the amount of software, firmware, or circuitry increases, reducing the amount of software, firmware, or circuitry for memory storage and command processing. Either or both of these problems results in performance declines in a memory device (e.g., read performance drops), longer latency in host operations, and more power consumed by the memory device.

The disclosed embodiments improve upon existing read disturb management techniques by scanning memory cells more efficiently, thereby improving read performance and saving power consumption. These results are achieved via a balanced multi-level read disturb management algorithm that improves the efficiency of read disturb scanning and unsafe data relocation. The following description of the figures provides further detail of the disclosed embodiments.

Figure 1:
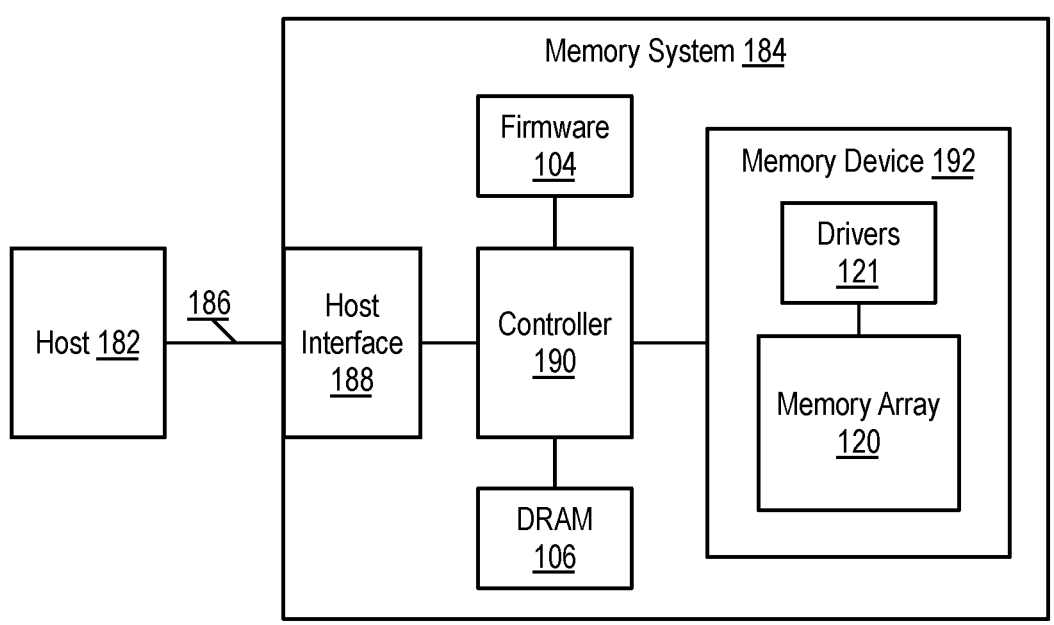
FIG. 1 illustrates a memory system having a controller that accesses data stored in a memory device, in accordance with some embodiments.

FIG. 1 illustrates a memory system 184 having a controller 190 that accesses data stored in a memory device 192, in accordance with some embodiments. In one example, memory array 120 a three-dimensional (3D) memory array. In some embodiments, multiple memory arrays 120 can be used.

Memory system 184 can be, for instance, a solid state drive (SSD), multimedia card (MMC), USB flash drive, compact flash card (CF), universal flash storage device (UFS), or other storage device, and can include a host interface 188, controller 190 (e.g., a processor and/or other control circuitry), and memory device 192 (e.g., solid state memory devices such as NAND flash devices), which provides a storage volume for the memory system 184. Memory device 192 can include one or more memory array(s) 120.

In a number of embodiments, the controller 190, the memory device 192, and/or the host interface 188 can be physically located on a single die or within a single package (e.g., a managed NAND application). In some embodiments, the controller 190, the memory device 192, and/or the host interface 188 are soldered to a printed circuit board (PCB). The controller 190, the memory device 192, and/or the host interface 188 can be packaged, for example, in a BGA module, M.2 module, mSATA module, slimSATA module, flash memory card, embedded USB card, small form factor (SFF) disk format (e.g., SFF-2.5, SFF-1.8, etc.), or other form-factor.

Memory device 192 includes drivers 121 that are used to apply signals to word-lines of memory array 120. In one embodiment, controller 190 accesses data stored in a first block of memory array 120 using a first word line. One of drivers 121, under control of controller 190, is used to access the data by applying a signal to the first word line. The word line signal is applied to corresponding tiers of the left block portion and right block portion of the first block. These two tiers logically correspond to the first word line. In one embodiment, each pair of corresponding tiers is connected by a conductive connector as described above.

The controller 190 can be coupled to the host interface 188 and to the memory device 192 via one or more channels and can be used to transfer data between the memory system 184 and a host 182. Host interface 188 can be in the form of a standardized interface. For example, when the memory system 184 is used for data storage in a computing system, the host interface 188 can be a serial advanced technology attachment (SATA), Serial Attached SCSI (SAS), peripheral component interconnect express (PCIe), or a universal serial bus (USB), among other connectors and interfaces. In general, however, host interface 188 can provide an interface for passing control, address, data, and other signals between the memory system 184 and host 182 (e.g., a host computing device having compatible receptors for the host interface 188).

Host 182 can be a host system such as a personal laptop computer, a desktop computer, a server, an embedded computer, a digital camera, a mobile telephone, a memory card reader, or other electronic device controlled by a processor, among various other types of hosts. Host 182 can include a system motherboard and/or backplane and can include a number of memory access devices (e.g., a number of processors). Host 182 can be coupled to the host interface 188 by a communication channel 186.

The controller 190 can communicate with the memory device 192 to control data read, write, and erase operations, among other operations, including equalization, discharge, and string driver operations. The controller 190 can include, for example, a number of components in the form of hardware and/or firmware (e.g., one or more integrated circuits), and/or software for controlling access to the memory device 192 and/or for facilitating data transfer between the host 182 and the memory device 192. In some embodiments, multiple memory devices can be used.

The memory device 192 can include a number of arrays of memory cells. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells, and an array can include a number of planes.

In some embodiments, host 182 can be a computer (e.g., mobile phone or other computing device) having one or more central processing units (CPUs) to which computer peripheral devices, such as the memory system 184, may be attached via an interconnect, such as a computer bus.

The memory system 184 can be used to store data for the host 182. Examples of memory system 184 include solid state drives, USB flash drives, multimedia cards (MMC), compact flash cards (CF), universal flash storage devices (UFS), memory cards, flash memory, or other memory devices.

Controller 190 can run firmware 104 to perform operations responsive to the communications from the host 182. Firmware in general is a type of computer program that provides control, monitoring, and data manipulation of engineered computing devices. In FIG. 1, the firmware 104 controls the operations of the controller 190 in operating the memory system 184, such as translating a logical address to a physical address for storing and accessing data in the memory device 192. In one example, the controller 190 is an internal controller of a managed NAND device that stores data in TLC NAND flash memory.

An example of non-volatile storage media used in memory array 120 is memory cells (e.g., SLC, TLC, QLC) in an integrated circuit. The storage media is non-volatile in that no power is required to maintain the data/information stored in the non-volatile storage media, which data/information can be retrieved after the non-volatile storage media is powered off and then powered on again. The memory cells may be implemented using various memory types, such as NAND gate based flash memory, phase-change memory (PCM), magnetic memory (MRAM), resistive random-access memory, and 3D XPoint, such that the storage media is non-volatile and can retain data stored therein without power for days, months, and/or years.

In one embodiment, during operation, controller 109 receives various commands from host 182. These commands can include a read command or a write command. In one example, a read command includes a logical address, and is received from host 182 to access stored data in non-volatile storage media of memory array 120.

In one example, controller 190 receives a logical address and determines a physical address. The physical address that is determined is used to read that portion of stored data that corresponds to the received logical address. Controller 190 then sends the read data to host 182. In some instances, the controller 190 has multiple processors, each having its own in-processor cache memory.

The memory system 184 can be used in various computing systems, such as a cloud computing system, an edge computing system, a fog computing system, and/or a stand-alone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage.

At least some embodiments of the disclosures herein can be implemented using computer instructions executed by the controller 190, such as the firmware 104. In some instances, hardware circuits can be used to implement at least some of the functions of the firmware 104. The firmware 104 can be initially stored in the non-volatile storage media of memory array 120, or another non-volatile device, and loaded into volatile memory, such as DRAM 106, and/or in-processor cache memory for execution by the controller 190.

A non-transitory computer storage medium can be used to store instructions of the firmware 104. When the instructions are executed by the controller 190 of the memory system 184, the instructions cause the controller 190 or other processing device(s) to perform methods as discussed herein.

In one embodiment, a local manager (not shown) of memory system 184 receives data access commands. A data access request (e.g., read, write) from the host 182 identifies an LBA address to read, write, or erase data from a memory unit identified by the LBA address. The local manager translates the logical address to a physical address.

In one embodiment, a controller is implemented by one or more processing devices. The processing device can be, for example, a microprocessor, a central processing unit (CPU), a processing core of a processor, an execution unit, an embedded processor, an embedded controller, a graphics processor, etc. The processing device can be, for example, a microcontroller, special purpose logic circuitry (e.g., a field programmable gate array (FPGA), an application specific integrated circuit (ASIC), a system on a chip (SOC), etc.), or another suitable processor. The processing device may be composed of a single processor with a single processing core, a single processor with multiple processing cores, or multiple processors.

In some embodiments, the controller includes a host I/O management component, a flash translation layer (FTL), and a memory unit management component. In some embodiments, these components may be implemented in DRAM 106.

In embodiments in which the memory (e.g., non-volatile storage media) includes a number of arrays of memory cells, the arrays can be flash arrays with a NAND architecture, for example. However, embodiments are not limited to a particular type of memory array or array architecture. The memory cells can be grouped, for instance, into a number of blocks, which are erased together as a group and can store a number of pages of data per block. A number of blocks can be included in a plane of memory cells and an array can include a number of planes. As used herein, a "page of data" refers to an amount of data that the controller is configured to write/read to/from the non-volatile storage media as part of a single write/read operation and can be referred to as a "flash page". As an example, a memory device may have a page size of 8 KB (kilobytes) and may be configured to store 128 pages of data per block, 2048 blocks per plane, and 16 planes per device.

Unlike with traditional hard disk drives, data stored in flash arrays cannot be directly overwritten. That is, a block of flash cells must be erased prior to rewriting data thereto (e.g., a page at a time). In some embodiments, the controller can manage data transferred between the host processor and the flash arrays via a logical-to-physical mapping scheme. For instance, a flash translation layer can employ a logical addressing scheme (e.g., logical block addressing (LBA)). As an example, when new data received from the host processor is to replace older data already written to the flash array, the controller can write the new data in a new location on the non-volatile storage media and the logical-to-physical mapping of the FTL can be updated such that the corresponding logical address(es) associated with the new data being written indicates (e.g., points to) the new physical location. The old location, which no longer stores valid data, will be erased prior to being written again.

Figure 2:
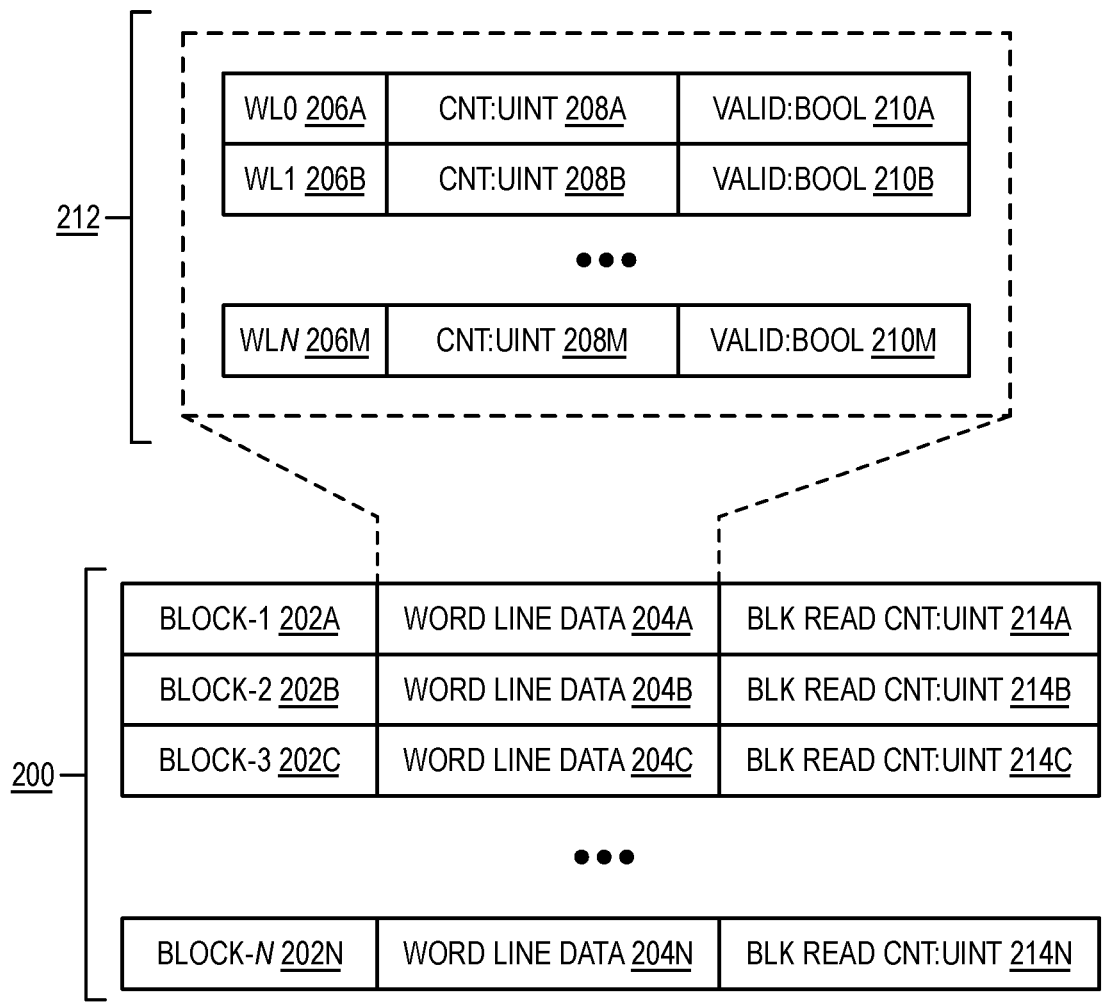
FIG. 2 illustrates a data structure for managing read disturbance operations used by a controller of a memory device, in accordance with some embodiments.

FIG. 2 illustrates a data structure for managing read disturbance operations used by a controller of a memory device, in accordance with some embodiments.

In some embodiments, the data structure (200) is stored in a memory device such as DRAM 106 of FIG. 1. In general, the data structure (200) is accessible by a controller (190) of a memory system (184). The controller (190) reads and writes to the data structure (200) based on accesses to a memory array (120). The data structure (200) is depicted in FIG. 2 in a block manner. That is, each element of the data structure (200) is illustrated as a "row" of the data structure (200). Various abstractions (e.g., in C++ or another language) may be used to represent the data structure (200) in an alternative manner.

Figure 5:
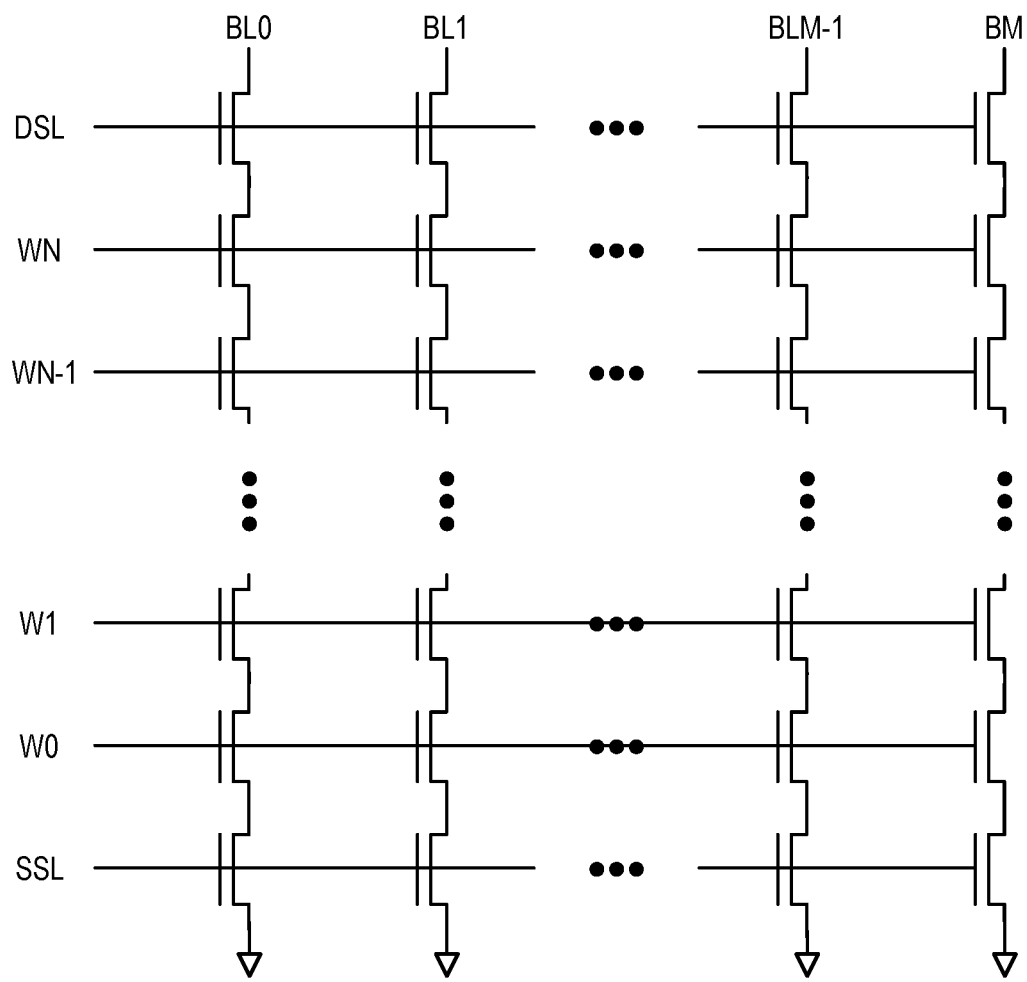
FIG. 5 is a circuit diagram of an exemplary memory block according to some embodiments of the disclosure.

In the illustrated embodiment, the data structure (200) includes a plurality of elements for each block of a memory array. In the illustrated embodiment, each element includes a block identifier (202a, 202b, 202c, . . . 202n) and a corresponding word line data structure (204a, 204b, 204c, . . . 204n). In some embodiments, as illustrated, each block identifier (202a, 202b, 202c, . . . 202n) is also associated with an unsigned integer (UINT) value (214a, 214b, 214c, . . . 214n) that represents the number of times a corresponding block was read from. The value of n is based on the number of blocks in the underlying memory array. As a brief aside, a given memory array may comprise one or more dies. Each die includes one or more planes and each plane includes a plurality of blocks. In each block there are a plurality of pages which comprise the smallest unit of data that can be written. Reference is made to FIG. 5 which illustrates a circuit diagram of an exemplary memory block according to some embodiments of the disclosure. In the illustrated embodiment, a given bit line (BL0, BL1, . . . BLM−1, BLM) comprises a series of transistors. The source of a first source select line (SSL) transistor in a series is connected to ground while its drain is connected to the source of the next transistors. The transistors connect in this manner with the drain of the final drain select line (DSL) transistor outputting to the bit line (BL0 . . . BLM). The gates of each transistor in a given row of the array is connected to word line (W0 . . . WN) or a DSL/SSL, respectively. Data is read from the memory array by applying a low voltage to the word line (W0 . . . WN) to be read. The charge stored in the corresponding word line transistors will be output on the corresponding bit lines (B0 . . . BM). Thus, for each word line (W0 . . . WN), an M-bit word can be read. To program cells in a block, data is written on the bit lines (B0 . . . BM). Then, a high voltage is applied to a desired word line (W0 . . . WN) of the page to program. In the illustrated embodiment, the DSL and SSL line controls corresponding drain select transistors (DSTs) and source select transistors (SST) for each bit line. When an SST is turned on, the source terminal is coupled to a source line. Similarly, when a DST is turned on, the drain terminal of the string of transistors is coupled to a bit line of the memory array.

Returning to FIG. 2, the data structure (200) stores a word line data structure for each block such as the block illustrated in FIG. 5. In one embodiment, the word line data structure comprises a pointer to another data structure such as data structure (212). In the illustrated embodiment, a given word line data structure (204a) is illustrated in expanded view as data structure (212). However, all word line data structures (204a, 204b, 204c, . . . 204n) are associated with corresponding data structures.

In the illustrated embodiment, a word line data structure (212) includes a data record for each word line (206a, 206b, . . . 206m) of a block, such as word lines W0 . . . WN in FIG. 5. In the illustrated embodiment, each word line (206a, 206b, . . . 206m) in a block (e.g., 202a) is associated with a counter value (208a, 208b, . . . 208m) and a valid flag (210a, 210b, . . . 210m).

In the illustrated embodiment, a given counter value (208a, 208b, 208m) is incremented (e.g., by a controller of a memory system) each time a corresponding word line (206a, 206b, . . . 206m) is read from. In the illustrated embodiment, the counter values (208a, 208b, . . . 208m) comprise unsigned integer values. Each word line (206a, 206b, . . . 206m) is additionally associated with a flag that indicates whether the data in the corresponding word line (206a, 206b, . . . 206m) is valid.

In one embodiment, counter values (208a, 208b, . . . 208m) can be updated as the controller raises the voltage on a word line, thus reading data from the word line. The word line validity flags (210a, 210b, . . . 210m) are set to logical zero if there are no valid bits in the corresponding word line. Otherwise, the value of validity flags (210a, 210b, . . . 210m) is set to one if at least one bit is valid. In alternative embodiments, the validity flags (210a, 210b, . . . 210m) may be set to zero if at least one bit is invalid and one otherwise. In some embodiments, the validity flags (210a, 210b, . . . 210m) may be set based on an existing table of the controller. In some embodiments, a controller maintains a bitmap of page validities. That is, each physical page of the memory is associated with flag indicating whether the page is valid or invalid. In some embodiments, the validity flags (210a, 210b, . . . 210m) may comprise pointers to entries in this existing table. Further, Alternatively, or in conjunction with the foregoing, the data structure (212) may discard the values of the counter values (208a, 208b, . . . 208m) and cease updating the values of the counter values (208a, 208b, . . . 208m) upon determining that the corresponding validity flag (210a, 210b, . . . 210m) is set to true. In this manner, the controller can reduce SRAM buffer usage by foregoing updates to read counts for individual word lines when the word line is determined to be invalid.

Figure 3:
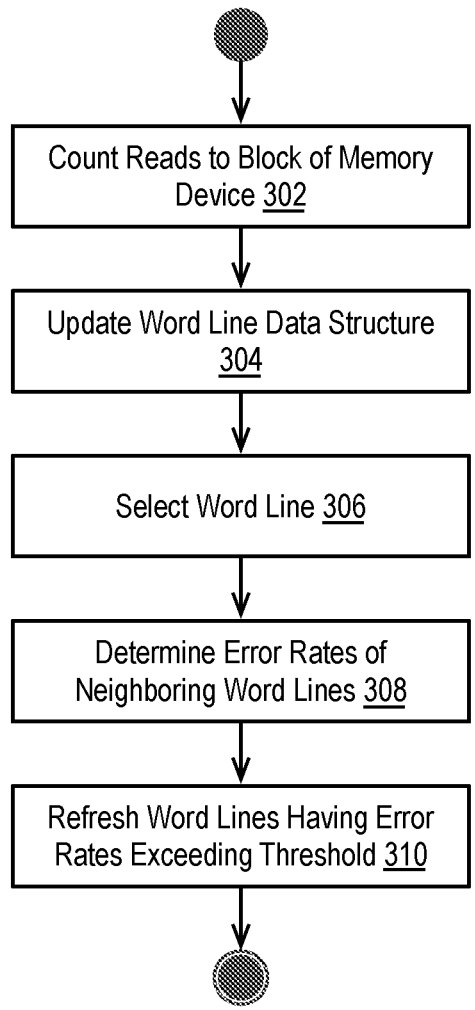
FIG. 3 is a flow diagram illustrating a method for managing read disturb operations according to some embodiments of the disclosure.

FIG. 3 is a flow diagram illustrating a method for managing read disturb operations according to some embodiments of the disclosure.

In step 302, the method counts the number of reads to a block in the memory array. In some embodiments, the number of reads may be counted by a counter associated with a given block, managed by a controller of the memory system. Each time a block is read from, a total number of reads of the block may be increased by one. In one embodiment, this value is record in the block read counter fields (214a, 214b, 214c, . . . 214n) of the data structure (200).

In step 304, the method updates word line data of a plurality of word lines in the block read in step 302 when the number of reads exceeds a block read count threshold. In some embodiments, the use of a block read count threshold may be optional. If implemented, the method will not update the word line data structures (204a, 204b, 204c, . . . , 204n) until the value of a corresponding counter field (214a, 214b, 214c, . . . 214n) exceeds the block read count threshold. Thus, as an example, if a read to block (202a) is detected and the value of read count (214a) is below the threshold, the method will not update word line data structure (204a, 212). If, however, the method has detected that the number of reads (214a) exceeds the threshold, the method will proceed to update the word line data structure (204a, 212). In one embodiment, the block read count threshold may be based on a number of reads in a read reclaim check period. In an embodiment, the block read count threshold is set to about half of the number of reads in a read reclaim check period. For example, the block read count threshold may be set to five thousand if the number of reads in the read reclaim check period is ten thousand. Other suitable values for the block read count threshold may be used.

If the total number of reads to the block is lower than the threshold, the corresponding word line data structure (204a, 204b, 204c, . . . , 204n) is not updated and the block is set to be ready to serve the next commands. In some embodiments, the value stored for a given word line data structure (204a, 204b, 204c, . . . , 204n) may be NULL. In one scenario, the method detects for the first time that the total number of reads is larger than a block read count threshold). In this scenario, the method creates a word line data structure for the corresponding the block.

In step 306, the method selects a word line from the plurality of word lines. The word line may be selected when the number of reads meets the number of reads in the read reclaim check period. In some embodiments, the word line selected may be the hottest word line of the block. The word line may be selected probabilistically. For example, the firmware may generate a random number (e.g., a random number uniformly distributed between [0,1]). If the number p is larger than a predetermined value (e.g., p may be set to 0.1% or 0.005%, etc.), the process may be ended without any reclaim. If the number is smaller than the predetermined value, the word line with the largest number of reads (e.g., the hottest word line) may be selected. The predetermined value may be adjusted based on the needs of the memory system.

In step 308, the method determines an error rate of a neighbor word line to the selected word line. The neighbor word line may be word line h+1 or h−1 in embodiments where the hottest word line h is selected. If the selected word line is a top or bottom word line, then the selected word line will have only one neighbor.

In step 310, the method reclaims data in the block if the error rate of the neighbor word line is determined to exceed an error threshold. The error threshold may be set to a value of acceptable error rate of the neighbor word line.

Figure 4:
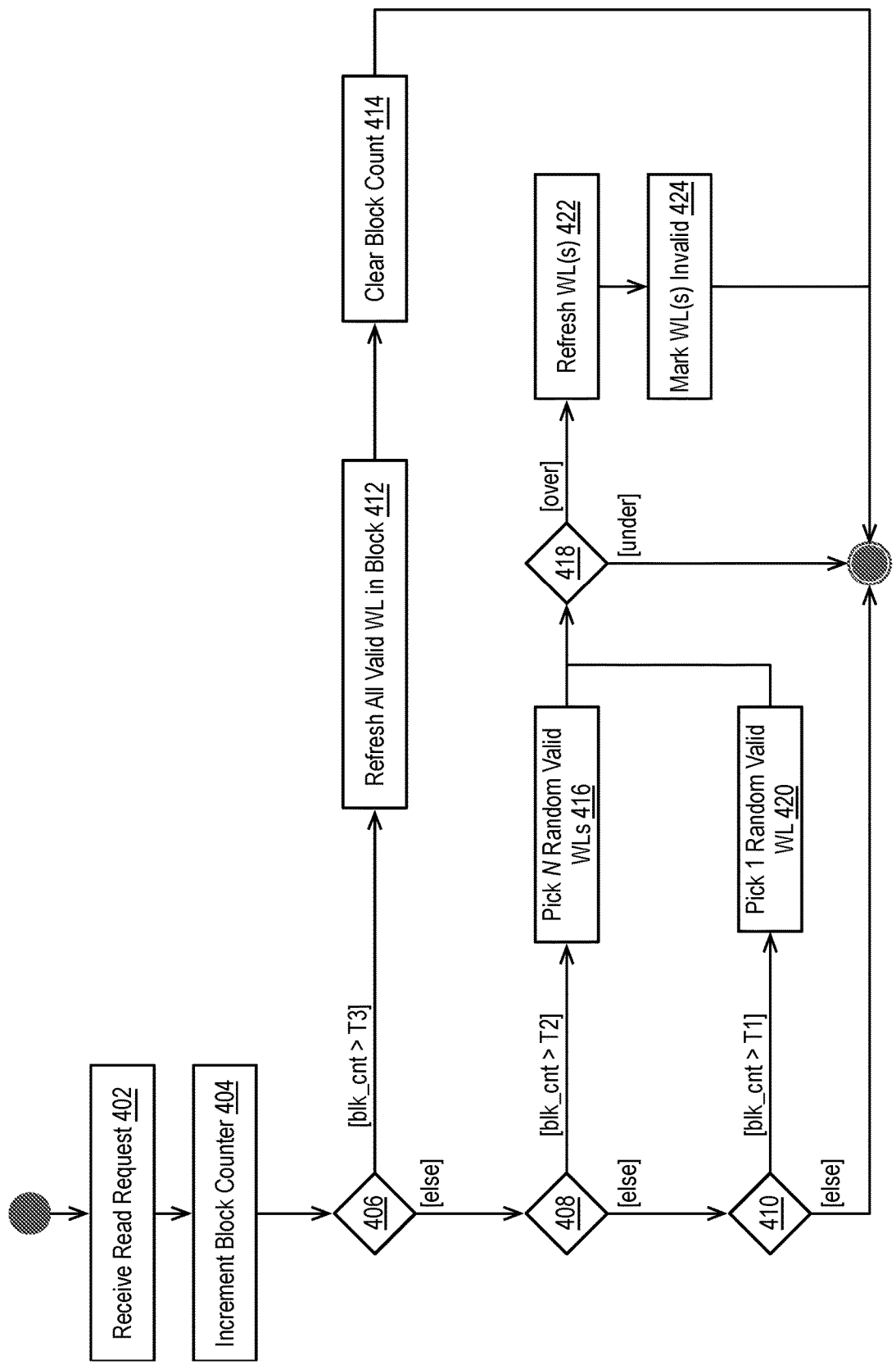
FIG. 4 is a flow diagram illustrating a method for managing read disturb operations using a multi-level threshold and enhanced data structure according to some embodiments of the disclosure.

While the foregoing method utilizes portions of the data structure (200), an alternative method is presented in FIG. 4 which improves upon various aspects of the method in FIG. 3. First, in some embodiments, the data on the hottest word line (step 306) could be invalid, however, it will still be refreshed in the method depicted in FIG. 3. When reaching the block read scan threshold, scanning on invalid hottest word line wastes resources and time and increases block worn out. Second, when the block scan threshold reached, the next read on that block will trigger a read disturb scan which reduces performance and is unnecessary. The method in FIG. 3 utilizes a random number p to mitigate this effect. However, the use of such a random number may bring unstable read performance and latency in certain memory systems. Third, identifying the hottest word line requires calculation by the firmware. If the block read count is already over threshold, and each read needs this calculation, the performance of the memory system is negatively impacted. Fourth, in many memory systems, one block count threshold is often not enough, as current NAND structures and processes are more complex and the environment the memory operates in is more inhospitable (e.g., subject to extreme temperatures, etc.).

FIG. 4 is a flow diagram illustrating a method for managing read disturb operations using a multi-level threshold and enhanced data structure (200) according to some embodiments of the disclosure. As compared to the method in FIG. 3, the method illustrated in FIG. 4 remedies the deficiencies identified above, reduces scan time, and increases overall performance of the memory system.

In step 402, the method receives a read request. In one embodiment, the read request comprises a request to read one or more pages from a given block.

In step 404, the method increments a block counter associated with the read request. In the illustrated embodiment, the read request may include a logical block address (LBA) of a memory location. This LBA is translated into a physical block address (PBA) using a Flash translation layer or logic (FTL). The PBA can then be used to identify the block associated with the read request. Next, the controller accesses the element associated with the block using a data structure (200) stored in an internal volatile memory such as a DRAM. As illustrated in FIG. 2, the method then increments a block counter (e.g., 214a, 214b, 214c, . . . , or 214n) associated with the identified block. If the block counter value is NULL, the method initializes the value to one.

In step 406, the method inspects the value of the block counter value and determines if the value of the block counter value (blk_cnt) for the block detected in steps 402 and 404 exceeds a threshold (T3).

As will be discussed, in the illustrated embodiment, three separate thresholds (T1, T2, T3) are utilized. In some embodiments, the value of T1 is less than T2 and T3 and the value of T2 is greater than T1 but less than T3. Thus, the thresholds satisfy the condition T1<T2<T3. In this arrangement, T3 represents a read count of a block that has the highest risk of read disturbance. Threshold T2 represents a read count where a risk of read disturbance is not guaranteed, but is probable. Threshold T1 comprises the lowest value and lowest risk of read disturbance. In some embodiments, the threshold T1 can be used to refresh data in memory when a device is operating in extreme conditions where disturbance is more likely despite lower read counts.

In the illustrated embodiment, the method undertakes different routines in response to exceeding the various thresholds. Further, if no threshold is breached in steps 406, 408, 410, the method ends and awaits further reads.

If the method detects that threshold T3 is reached in step 406, the method refreshes all valid word lines in the block in step 412. In this step, the method accesses the word line data (204a, 204b, 204c, . . . , 204n) for the given block and iterates through each word line (206a, 206b, . . . , 206m). For each word line word line (206a, 206b, . . . , 206m), the method accesses the corresponding validity flag (210a, 210b, . . . 210m). If the flag (210a, 210b, . . . 210m) is set to true, the method refreshes the data in the corresponding word line (206a, 206b, . . . , 206m). In one embodiment, refreshing the word line comprises reading the data from the word line and writing the word line to a second block. In some embodiments, the method may first determine if the read count of the second block exceeds threshold T3 and if the second block read count exceeds that threshold, will select another block until a selected block's read count does not exceed T3. Alternatively, the method may write the valid data to the second block regardless of its read count.

As indicated, if the value of the flag (210a, 210b, . . . 210m) of a word line (206a, 206b, . . . , 206m) indicates the word line (206a, 206b, . . . , 206m) is invalid, the method skips refreshing the invalid data.

After refreshing the data from all valid word lines in the block, the method resets the corresponding block counter value (214a, 214b, 214c, . . . , 214n) for the block to zero in step 414, allowing for future writes. After step 414, the method ends.

If the method detects that the block counter value (214a, 214b, 214c, . . . , 214n) of the block identified in steps 402 and 404 is below T3, the method then determines if the block counter value (214a, 214b, 214c, . . . , 214n) of the block identified in steps 402 and 404 exceeds T2. If so, the method proceeds to step 416.

In step 416, the method selects N random valid word lines from the block. As described above, the method accesses the word line data (204a, 204b, 204c, . . . , 204n) for the given block and iterates through each word line item (206a, 206b, . . . 206m) to identify a set of valid word lines. The method then randomly samples the valid word lines to set a set of N random valid word lines. In some embodiments, the value of N may be set according to the needs of the memory system. In some embodiments, the value of N is greater than or equal to two (2).

After selecting the N valid word lines in a block, the method then determines if any of the valid word lines have an error rate exceeding an error rate threshold. If no valid word lines have an error rate exceeding the error rate threshold, the method ends, and awaits the next read operation. As described above, the error rate threshold may be configured in firmware of the memory system and may comprise a fixed number of reads before an error is presumed to occur. For example, the error rate threshold may be set at 10,000 reads. As illustrated in FIG. 2, the data structure (200) includes a read count for each word line. Thus, to determine if a word line has exceeded an error rate threshold, the method compares the read count in the data structure (200) to the threshold and determines if the value stored in the data structure (200) exceeds the threshold.

Alternatively, if the method determines that one or more of the valid word lines has an error rate exceeding the error rate threshold, the method selects those word lines having error rates exceeding the error rate threshold and refreshes the word lines in step 422. In one embodiment, the method refreshes a word line by reading the word line data and copying the word line data to a different word line. In other embodiments, the method writes the word line data to a different block. Finally, in step 424, the method marks word lines having error rates exceeding the error rate threshold as invalid. In one embodiment, by marking the word lines having error rates exceeding the error rate threshold as invalid, the data will ultimately be released during a garbage collection procedure performed by the controller.

In the illustrated embodiment, if the method detects that the block counter value (214a, 214b, 214c, . . . , 214n) of the block identified in steps 402 and 404 is below T3 and T2, the method then determines if the block counter value (214a, 214b, 214c, . . . , 214n) of the block identified in steps 402 and 404 exceeds T1. If so, the method proceeds to step 420.

In step 420, the method selects a single, random valid word line from the block. As described above, the method accesses the word line data (204a, 204b, 204c, . . . , 204n) for the given block and iterates through each word line item (206a, 206b, . . . 206m) to identify a set of valid word lines. The method then randomly samples the valid word lines to set one random valid word lines.

After selecting the valid word line, the method then determines if the valid word line has an error rate exceeding an error rate threshold. If not, the method ends, and awaits the next read operation. As described above, the error rate threshold may be configured in firmware of the memory system and may comprise a fixed number of reads before an error is presumed to occur. For example, the error rate threshold may be set at 10,000 reads. As illustrated in FIG. 2, the data structure (200) includes a read count for each word line. Thus, to determine if a word line has exceeded an error rate threshold, the method compares the read count in the data structure (200) to the threshold and determines if the value stored in the data structure (200) exceeds the threshold.

Alternatively, if the method determines that the valid word lines has an error rate exceeding the error rate threshold, the method selects the word line and refreshes the word line in step 422. In one embodiment, the method refreshes a word line by reading the word line data and copying the word line data to a different word line. In other embodiments, the method writes the word line data to a different block. Finally, in step 424, the method marks word line exceeding the error rate threshold as invalid. In one embodiment, by marking the word line having an error rates exceeding the error rate threshold as invalid, the data will ultimately be released during a garbage collection procedure performed by the controller.

In the illustrated embodiment, by utilizing multiple thresholds, the additional read scan function is short at the lowest threshold T1 (i.e., reading a single word line) with minimal impact on read performance. At second threshold T2, the increased read scan functions to cover the risk of read disturb. At the highest threshold T3, the refresh is automatically executed no matter the error rate of that block, which reduces the later frequently reading scan on this block.

Additionally, the method illustrated in FIG. 4 randomly picks a word line with valid data instead of the hottest word line as performed in FIG. 3. This selection balances the scan location and reduces the wear-out on the hottest word line. If host reads the same word line continuously, the read disturb will scan on balanced location without missing the dangerous word line. By randomly picking word lines between the lowest threshold T1 and the highest threshold T3, each new read will trigger a read disturb scan and the amount of read disturb scan is enough to find the high potential of read error word line.

Finally, the method in FIG. 4 only refreshes the word lines having an error rate exceeding the error rate threshold and marks the word lines as invalid after refresh. This reduces refresh loading and avoids refresh impacts on host operations.

The disclosure includes various devices which perform the methods and implement the systems described above, including data processing systems which perform these methods, and computer readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and operations may be described as being performed by or caused by software code to simplify description. However, those skilled in the art will recognize what is meant by such expressions is that the functions result from execution of the code by one or more processors, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computing device or other system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions.

In general, a tangible or non-transitory machine readable medium includes any mechanism that provides (e.g., stores) information in a form accessible by a machine (e.g., a computer, mobile device, network device, personal digital assistant, manufacturing tool, any device with a set of one or more processors, etc.).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method comprising:
   receiving a read request for a memory array;
   retrieving a value of a read counter for a block associated with the read request;
   refreshing valid word lines in the block if the value of the read counter exceeds a first threshold;
   identifying a set of valid word lines in the block if the value of the read counter exceeds a second threshold, the second threshold lower than the first threshold;
   identifying a subset of the set of valid word lines, the subset of the set of valid word lines including word lines having an error rate above a pre-configured error rate threshold;
   refreshing the subset of the set of valid word lines; and
   marking each word line in the subset of the set of valid word lines as invalid.

2. The method of claim 1, further comprising incrementing the read counter for the block prior to retrieving a value of the read counter.

3. The method of claim 1, further comprising setting the value of the read counter to zero after refreshing the valid word lines.

4. The method of claim 1, wherein identifying the set of valid word lines comprises identifying at least two valid word lines in the block.

5. The method of claim 1, further comprising:
   identifying a single valid word line in the block if the value of the read counter exceeds a third threshold, the third threshold lower than both the second and first thresholds; and
   refreshing the single valid word line if the single valid word line has an error rate above the pre-configured error rate threshold.

6. The method of claim 5, further comprising marking the single valid word line as invalid after refreshing the single valid word line.

7. A device comprising:
   a memory array;
   a volatile memory device, the volatile memory device comprising a data structure representing blocks and word lines in the memory array, the data structure storing data associated with a plurality of blocks of the memory array; and
   a controller, the controller configured to:
      receive a read request for a memory array,
      retrieve a value of a read counter for a block associated with the read request from the data structure stored in the volatile memory device,
      refresh valid word lines in the block if the value of the read counter exceeds a first threshold,
      identify a set of valid word lines associated with the block in the data structure if the value of the read counter exceeds a second threshold, the second threshold lower than the first threshold,
      identify a subset of the set of valid word lines in the data structure, the subset of the set of valid word lines including word lines having an error rate above a pre-configured error rate threshold,
      refresh the subset of the set of valid word lines, and
      mark each word line in the subset of the set of valid word lines as invalid by updating corresponding word line data structures in the data structure, the updating including setting a Boolean flag in the corresponding word line data structures.

8. The device of claim 7, the controller further configured to increment the read counter for the block prior to retrieving a value of the read counter.

9. The device of claim 7, the controller further configured to set the value of the read counter to zero after refreshing the valid word lines.

10. The device of claim 7, wherein identifying the set of valid word lines comprises identifying at least two valid word lines in the block.

11. The device of claim 7, the controller further configured to:
- identify a single valid word line in the block if the value of the read counter exceeds a third threshold, the third threshold lower than both the second and first thresholds; and
- refresh the single valid word line if the single valid word line has an error rate above the pre-configured error rate threshold.

12. The device of claim 11, the controller further configured to mark the single valid word line as invalid after refreshing the single valid word line.

13. A non-transitory computer-readable storage medium for tangibly storing computer program instructions capable of being executed by a computer processor, the computer program instructions defining the steps of:
- receiving a read request for a memory array;
- retrieving a value of a read counter for a block associated with the read request;
- refreshing valid word lines in the block if the value of the read counter exceeds a first threshold;
- identifying a set of valid word lines in the block if the value of the read counter exceeds a second threshold, the second threshold lower than the first threshold;
- identifying a subset of the set of valid word lines, the subset of the set of valid word lines including word lines having an error rate above a pre-configured error rate threshold;
- refreshing the subset of the set of valid word lines; and
- marking each word line in the subset of the set of valid word lines as invalid.

14. The non-transitory computer-readable storage medium of claim 13, the computer program instructions further defining the step of incrementing the read counter for the block prior to retrieving a value of the read counter.

15. The non-transitory computer-readable storage medium of claim 13, the computer program instructions further defining the step of setting the value of the read counter to zero after refreshing the valid word lines.

16. The non-transitory computer-readable storage medium of claim 13, the computer program instructions further defining the steps of:
- identifying a single valid word line in the block if the value of the read counter exceeds a third threshold, the third threshold lower than both the second and first thresholds; and
- refreshing the single valid word line if the single valid word line has an error rate above the pre-configured error rate threshold.

17. The non-transitory computer-readable storage medium of claim 16, the computer program instructions further defining the step of marking the single valid word line as invalid.

* * * * *